United States Patent [19]
Worsham, Jr.

[11] Patent Number: 5,414,385
[45] Date of Patent: May 9, 1995

[54] DUAL MODE FM QUADRATURE DETECTOR

[75] Inventor: James A. Worsham, Jr., Duluth, Ga.

[73] Assignee: Matsushita Communication Industrial Corporation of America, Peachtree City, Ga.

[21] Appl. No.: 199,681

[22] Filed: Feb. 22, 1994

[51] Int. Cl.$^6$ ............................................. H03D 3/06
[52] U.S. Cl. .................................... 329/337; 455/214
[58] Field of Search ................ 329/337, 336; 455/214, 455/337

[56] References Cited

U.S. PATENT DOCUMENTS

| | | | |
|---|---|---|---|
| 4,198,609 | 4/1980 | Ishigaki et al. | 329/136 |
| 4,562,404 | 12/1985 | Futakuchi | 329/118 |
| 5,077,538 | 12/1991 | Gehrt et al. | 329/319 |
| 5,293,135 | 3/1994 | McGinn | 329/337 |

*Primary Examiner*—Siegfried H. Grimm
*Attorney, Agent, or Firm*—Jones & Askew

[57] ABSTRACT

A dual mode quadrature detector (15) uses the same components for both narrow band and wide band operation and provides an output amplitude which is independent of the mode of operation selected. A multiplier (32) provides a demodulated output signal (16) which is responsive to the phase difference between a signal (14) at one input (32A) and a phase shifted version of the signal at the other input (32B). A capacitor (30) and a phase shifting circuit (31) provide the phase shifted version of the signal. The phase shifting circuit (31) is responsive to a mode control signal (24) for determining the phase shift which is provided. The phase shift at the maximum frequency deviation of the narrow band signal is the same as the phase shaft at the maximum deviation of the wide band signal so that the output amplitude from the detector (15) is the same for both narrow band and wide band operation. The phase shift provided is controlled by varying the quality factor (Q) of the phase shifting circuit (31). This is achieved by controlling the amount of resistance placed in parallel with a tuned circuit (33, 34) in the phase shifting circuit (31). A higher Q is obtained by using a higher resistance, and a lower Q is obtained by using a lower resistance.

15 Claims, 2 Drawing Sheets

DUAL MODE FM QUADRATURE DETECTOR

TECHNICAL FIELD

The present invention relates to frequency modulation (FM) quadrature detectors and more particularly to an FM quadrature detector which can accommodate more than one FM modulation bandwidth while maximizing commonality of parts.

BACKGROUND OF THE INVENTION

The cellular mobile telephone system uses two different modes of FM operation: a wide band FM modulation mode; and a narrow band FM modulation mode. Wide band modulation provides greater noise immunity but narrow band modulation provides a greater number of channels per a given band of frequencies. In order to be usable regardless of the operation mode a cellular mobile telephone needs to be able to accommodate both modes of operation. The received FM signal, whether wide band or narrow band, and whether being acted upon by a cellular mobile telephone or by a base station of a mobile switching center (MSC), is typically first converted to an intermediate frequency (IF) signal and then demodulated to recover the audio signal represented by the received FM signal. An FM quadrature detector is commonly used to demodulate the FM IF signal and provide a demodulated output signal. However, a quadrature detector configured to optimally detect wide band signals will provide a very low demodulated output signal when the received signal is a narrow band signal. Furthermore, a quadrature detector configured to optimally detect narrow band signals will provide a distorted or unusable demodulated output signal when the received signal is a wide band signal. Therefore, the detector is typically configured for wideband operation and, for narrowband operation, the gain of a subsequent amplifier stage is increased or an additional amplifier is switched into the signal path. However, this has the disadvantage in that the desired signal is narrow band, but noise is wideband and may be present at frequencies which give a greater output voltage than the desired signal, so noise immunity is compromised. Also, two separate detectors may be used, one for demodulating wide band signals and one for demodulating narrow band signals. However, the above methods suffer from one or more of the following disadvantages: duplication of parts; extra space for the circuitry; increased costs; and increased power consumption. Therefore, there is a need for an FM quadrature detector which will optimally respond to both narrow band and wide band FM signals.

SUMMARY OF THE INVENTION

The present invention provides an FM detector which uses the same components to provide for demodulation of both wide band and narrow band FM signals. The present invention maximizes the common use of components for both types of signals and therefore minimizes cost, space, and power requirements for a cellular mobile radiotelephone.

The present invention makes use of the characteristic of a quadrature detector in that it provides a demodulated output signal which is proportional to the phase difference between a first signal, such as an input IF FM signal, and a phase delayed version of that signal, and to the characteristic of a tuned circuit in that it has a phase shift which is dependent upon the quality factor (Q) of the tuned circuit and upon the difference between the frequency of the input signal and the resonant frequency of the tuned circuit. In general, tuned circuits are used to reject unwanted frequencies and so the Q is made as high as is possible, commensurate with the bandwidth of the desired signal and the cost objectives of the end device. However, the present invention deliberately reduces and varies the Q so as to achieve a selectable phase shift. The Q of the tuned circuit is selected to achieve a desired phase shift at a specified maximum frequency deviation from the IF center frequency. Therefore, for narrow band FM, where the frequency deviation is +/−5.7 kHz from the center frequency, the Q of the tuned circuit is set to produce a desired phase shift at that frequency deviation. Then, for wide band FM, where the frequency deviation is +/−14 kHz from the center frequency, the Q of the tuned circuit is changed so as to produce that desired phase shift at that greater frequency deviation. In the preferred embodiment, the Q of the tuned circuit is varied by varying a resistance placed in parallel with a parallel tuned circuit. For narrow band FM, a higher resistance value is used so as to provide a higher Q and, therefore, a specified phase shift for the small maximum frequency deviation. Conversely, when wide band FM is in use, a lower resistance value is used so as to provide a lower Q and, therefore, the same phase shift for the large maximum frequency deviation. The end result is that, for a given maximum frequency deviation, the Q of the tuned circuit is selected to provide the optimal phase shift for input to the quadrature detector.

The present invention provides an FM detector responsive to a mode control signal for demodulating an input FM signal to provide a demodulated output signal. The FM detector has a multiplier and a phase shifting capacitor, and a phase shifting circuit. The phase shifting circuit has a tuned circuit which has a variable quality factor (Q) and is connected to the input FM signal through the phase shifting capacitor. When the mode control signal is in a first state the tuned circuit has a first Q and provides a phase shifted input FM signal having a desired phase shift. When the mode control signal is in a second state the tuned circuit has a second Q and provides a phase shifted input FM signal again having the desired phase shift. The multiplier has a first input connected to the input FM signal and a second input connected to the phase shifted input FM signal and provides a product signal by multiplying the input FM signal and the phase shifted input FM signal. Bandpass filters remove undesired signals from the product signal to provide the demodulated output signal. In the preferred embodiment, the demodulated output signals comprise an audio output signal and a control information signal. In an alternative embodiment, the filters are lowpass filters.

The phase shifting circuit has a parallel resonant circuit connected between the second input and a reference point, and is responsive to the mode control signal for providing either the first Q or the second Q.

The parallel resonant circuit has a capacitor connected between the second input and the reference point, an inductor connected in parallel with the capacitor, and a resistor circuit, connected in parallel with the capacitor. The resistor circuit is responsive to the mode control signal for providing either the first Q or the second Q by providing either a first resistance or a second resistance.

In one implementation the resistor circuit has a first resistor, a second resistor, and a switch connected to the first resistor and the second resistor. The switch is responsive to a mode control signal for connecting either the first resistor or the second resistor in parallel with the capacitor.

In another implementation the resistor circuit has a resistor having a tap point, and a switch. The resistor provides a resistance value, and the tap point provides a portion of the resistance value. The switch is connected to the resistor and to the tap point, and is responsive to the mode control signal for connecting either all of the resistor in parallel with the capacitor or the portion of the resistor in parallel with the capacitor.

In another implementation the resistor circuit has a first resistor, a second resistor connected in series with the first resistor to form a series resistor, and a switch, connected to the series resistor. The switch is responsive to the mode control signal for connecting either the first resistor or the series resistor in parallel with the capacitor.

The present invention also provides a dual mode FM receiver which uses the above FM demodulator. The receiver has a receiver front end for receiving an input RF signal and providing an IF signal, a demodulator including the phase shifting capacitor and phase shifting circuit as described above, a multiplier as described above, filters as described above, and a controller responsive to a control information signal contained in said IF signal for providing the mode control signal.

A base station of a mobile switching center, not shown, transmits as part of the transmitted FM signal, a control information signal which specifies, among other things, whether wide band or narrow band, such as NAMPS, transmission is to be used. This transmitted FM signal is received by the cellular telephone, amplified, and demodulated to recover the control information signal. The controller inspects this signal for the command as to the mode (wide band or narrow band) of operation, and then provides the mode control signal to the quadrature detector. The mode control signal specifies whether a wide band or a narrow band FM signal is to be demodulated.

The present invention also provides a method for demodulating an input FM signal to provide a demodulated output signal. The method provides for responding to the mode control signal being in a first state for providing a phase shifted input FM signal having a desired phase shift for a first maximum frequency deviation, and responding to the mode control signal being in a second state for providing the phase shifted input FM signal having the desired phase shift for a second, different, maximum frequency deviation, providing a product signal by multiplying the input FM signal and the phase shifted input FM signal, and providing the demodulated output signal by removing undesired signals from the product signal.

The method provides that the step of responding to the mode control signal comprises providing the phase shifted input FM signal by varying the quality factor (Q) of a tuned circuit in response to the mode control signal.

The method further provides that the step of responding to the mode control signal comprises varying the resistance of a resistor in the tuned circuit in response to the mode control signal.

DETAILED DESCRIPTION

Figure 1:
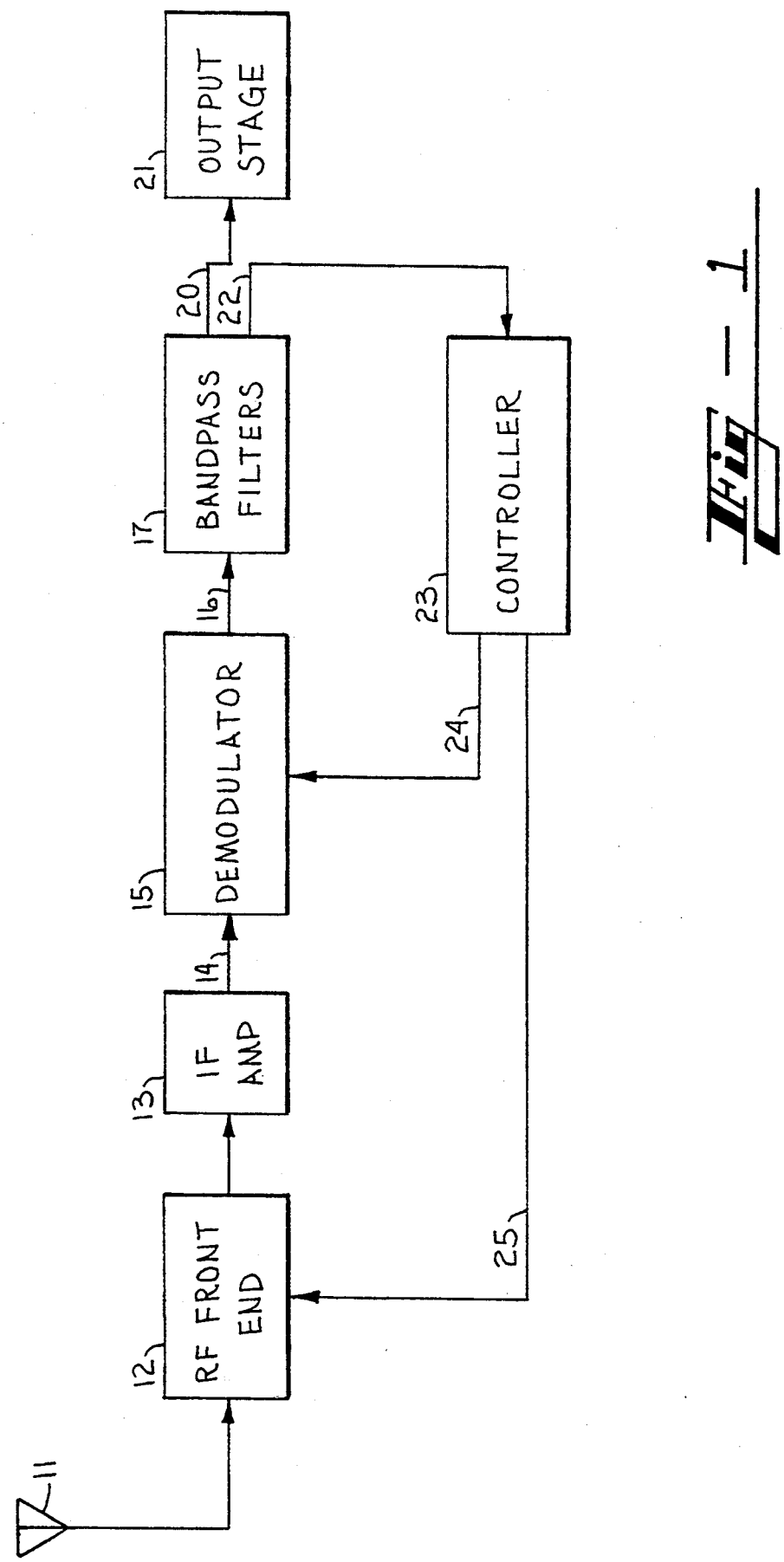
FIG. 1 is a block diagram of the preferred embodiment of the present invention in a receiver.

Turning now to the drawings, in which like numerals reference like components throughout the several figures, the preferred embodiment of the present invention will be described. FIG. 1 is a block diagram of the preferred embodiment of the present invention in a receiver 10 of a cellular telephone. A radio frequency (RF) signal transmitted by a base station of the mobile switching center (MSC) (not shown) is received by the antenna 11 and amplified and converted to an intermediate frequency (IF) signal by RF front end 12. This IF signal is then limited and amplified by an IF amplifier 13. The IF signal 14 output by IF amplifier 13 is then demodulated by demodulator 15. Demodulator 15 is the dual mode quadrature detector of the present invention and is described in more detail below. Demodulator 15 provides the demodulated signal 16 to a bandpass filters section 17. The demodulated signal 16 may contain voice signals, supervisory audio tones, signaling tones, digital supervisory audio tones, and/or sub audible 100 bits per second data. Bandpass filters section 17 separates the demodulated signal 16 into an audio signal portion 20, which is provided to an output stage 21, and a control information signal portion 22, which is provided to a controller 23. Output stage 21 amplifies the audio signal 20 and provides an amplified audio signal to an end device, such as a speaker (not shown) or the receiver in a handset (not shown). The control information portion 22 is inspected by controller 23 to determine what action should be taken. The control information 22 may contain such instructions as: wide band or narrow band operation, channel assignment, power control, identification information, muting, etc. Controller 23 then takes the action specified by the instructions in control information 22.

Typically, when a receiver 10 first is turned on, or first comes into an area which has cellular mobile telephone service, the receiver 10 will be in the wide band mode. The controller 23 will cause the RF front end 12 to tune into a paging channel and may identify itself to the MSC at that time or at a later time. The controller 23 will then remain on that channel until instructed by the MSC to move to another channel. The MSC may instruct controller 23 to move to another channel when, for example, there is an incoming call for receiver 10, or when controller 23 advises the MSC that the user wishes to place an outgoing call. The MSC, in addition to specifying the channel to be used, will also specify whether wide band or narrow band operation is to be used. The controller 23 will then provide a channel assignment (frequency control) signal 25 to cause the RF front end 12 to change to the designated channel and provide a mode control signal 24 to cause demodulator 15 to switch, if necessary, to the designated mode (wide band or narrow band) of operation. Once the new channel has been tuned in and the mode selected the controller 23 will then monitor control information signal 22 for later instructions from the MSC, such as wide band or narrow band operation, channel assignment, power control, identification information, muting, etc. Therefore, controller 23 always has instructions from the MSC as to whether wide band or narrow band operation is to be used.

It will be understood that a cellular mobile telephone also has a transmitter section, which is also controlled by controller 23. The design and construction of a transmitter section of a cellular mobile telephone is well known to those of ordinary skill in the art, and is not shown so as to focus the reader and the disclosure on the preferred embodiment of the present invention.

Figure 2:
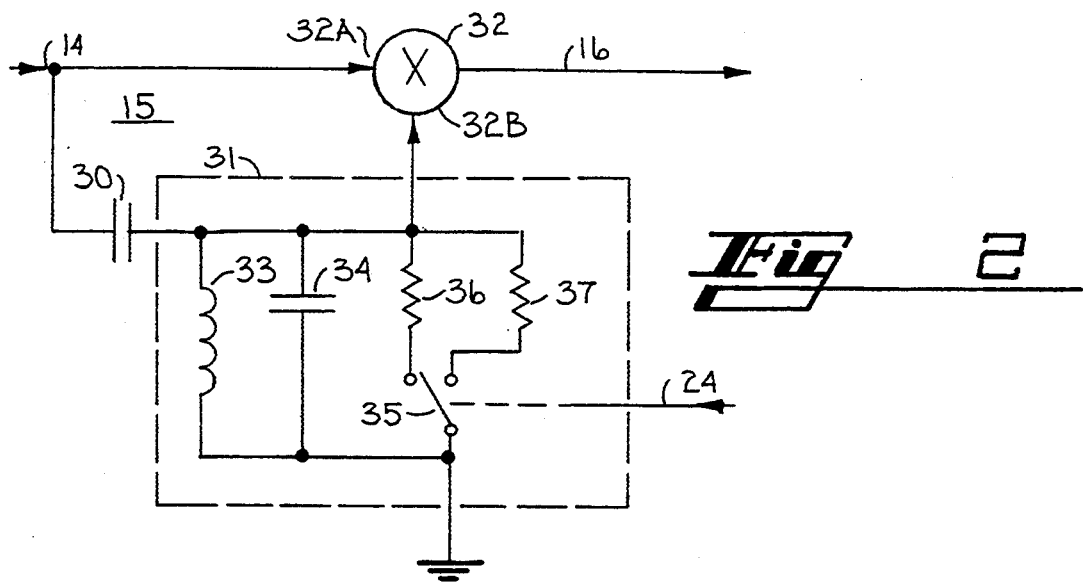
FIG. 2 is a schematic diagram of the preferred embodiment of the FM detector of the present invention.

Turn now to FIG. 2 which is a schematic diagram of the preferred embodiment of the FM detector 15 of the present invention. Detector 15 comprises an isolation and phase shifting capacitor 30, a phase shifting circuit 31, and a multiplier 32. The input IF signal 14 is provided to one input 32A of the multiplier 32. The input IF signal 14 is also provided, via capacitor 30, to the phase shifting circuit 31, and to the other input 32B of multiplier 32. The capacitor 30 provides a phase shift of 90° and also serves to isolate the input IF signal 14 provided to input 32A of multiplier 32 from the effects of phase shifting circuit 31. In order for capacitor 30 to provide the desired 90° phase shift, the impedance of capacitor 30 should be much greater than the impedance of the phase shifting circuit 31 at the frequency of interest. Phase shifting circuit 31 provides an additional phase shift which is dependent upon the difference between the frequency W of the input IF signal 14 and the resonant frequency WO of phase shifting circuit 31. The output of multiplier 32 is the product of the signals at inputs 32A and 32B and contains undesired products of the multiplication as well as the desired demodulated signal. The undesired products are easily removed by bandpass filters 17. The demodulated signal 16 has an amplitude which is proportional to the phase difference between the input IF signal 14 at input 32A and the phase shifted signal at input 32B. Bandpass filters 17 also serve to separate the audio (voice) part of the demodulated signal 16 from the control information part. The cutoff frequencies of bandpass filters 17 are selected so as to pass the desired signal with an acceptable distortion level. In the preferred embodiment, a pass band of approximately 300 Hz to 3000 Hz is used for the audio signal, and a pass band of approximately 3 kHz to 10 kHz is used for the control information. These frequencies are not critical.

Phase shifting circuit 31 comprises an inductor 33, a capacitor 34, a switch 35, and two quality factor (Q) determining resistors 36 and 37 connected between the junction of capacitor 30/input 32B and a reference point, such as signal ground. Inductor 33 and capacitor 34 are connected in parallel and form a conventional resonant circuit which has a resonant frequency WO. Switch 35 selects one of the two resistors 36 and 37 to be in parallel with inductor 33 and capacitor 34 and to affect the Q of phase shifting circuit 31. If the selected resistor has a high resistance then the Q is high and the phase shift will vary rapidly as the frequency W of the input IF signal deviates from the resonant frequency WO. If the selected resistor has a low resistance then the Q is low and the phase shift will vary slowly as the frequency W of the input IF signal deviates from the resonant frequency WO. Although the phase shift is not a linear function of the frequency deviation it is approximately linear if the frequency deviation is small. Ideally, the phase shift provided with the higher resistance at a maximum frequency deviation of 5.7 kHz will be the same as the phase shift provided with the lower resistance at a maximum frequency deviation of 14 kHz so that the output amplitude of the detector will be the same in both cases.

The frequency deviation is 14 kHz for wide band operation and 5.7 kHz for narrow band operation and, in the preferred embodiment, this deviation is sufficiently small to provide an acceptable quality demodulated output signal 16. If the frequency deviation is too large then the phase shift will not be linear and the demodulated output signal 16 will be distorted. The degree of distortion which is acceptable is subjective and depends upon the end use of the output signal 16 and the environment in which it will be used.

The combination of capacitor 30 and phase shifting circuit 31 provides a phase shift which is $\pi/2 - \text{ARCTAN}[Q((W/WO)-(WO/W))]$. If $W=WO+/-MWO$, where MWO is the frequency deviation and M is the modulation factor, and if MWO is very small compared to WO, then the change in the phase shift due to the frequency deviation may be approximately represented as $\text{ARCTAN}[2QM]$. The multiplier 32 therefore provides an output which is approximately KQM within the frequency deviation of interest, where K is a constant. The output of multiplier 32 also provides other products which are removed by the bandpass filters 17. As the frequency deviation MWO is linearly dependent upon the amplitude of the modulating signal at the transmitter it will be seen that the output of the multiplier 32 is the desired demodulated signal.

In the operation of the present invention, controller 23 provides a mode control signal 24 to switch 35. If wide band operation is specified then a lower Q is desired and controller 23 causes switch 35 to select the resistor 36, 37 which has the lower resistance value. This causes the ARCTAN [2QM] portion of the phase shift to vary more slowly as a function of the frequency deviation. If narrow band operation is specified then a higher Q is desired and controller 23 causes switch 35 to select the resistor 36, 37 which has the higher resistance value. This causes the ARCTAN [2QM] portion of the phase shift to vary more rapidly as a function of the frequency deviation. Ideally, the product of the higher Q and the maximum narrow band modulation factor M is equal to the product of the lower Q and the maximum wide band modulation factor M so that the peak amplitude of the output signal from multiplier 32 is fixed, regardless of the mode selected. Therefore, the user does not have to adjust the volume control nor does the gain of an amplifier have to be changed in the event that the MSC specifies a switch from wide band operation to narrow band operation, or vice versa.

Although two resistors 36, 37 are shown, it will be appreciated that the resistor having the higher value resistance may be eliminated if the inherent Q of the tuned circuit formed by inductor 33 and capacitor 34 is satisfactory for narrow band operation.

Figure 3:
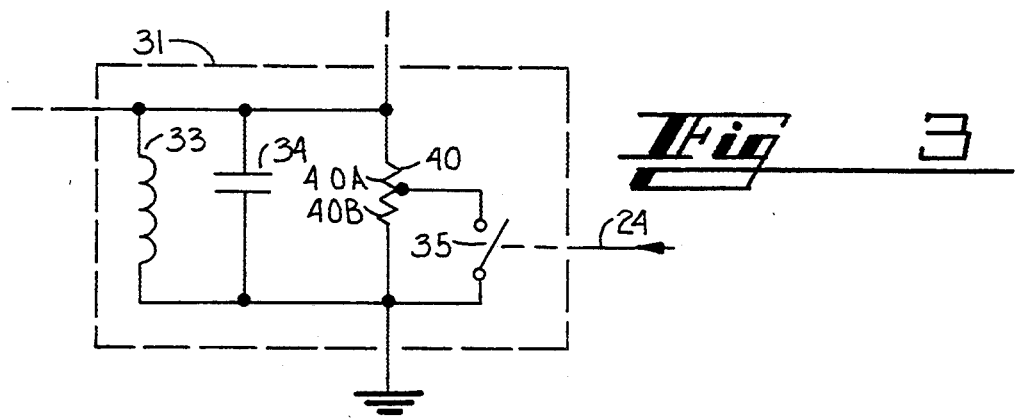
FIG. 3 is a schematic diagram of an alternative embodiment of the phase shifting circuit.

FIG. 3 is a schematic diagram of an alternative embodiment of the phase shifting circuit 31. In this embodiment a single, tapped resistor 40 is used instead of two resistors 36, 37. Resistor 40 has two segments, 40A and 40B. If narrow band (high Q) operation is desired then controller 23 causes switch 35 to be open so that both segments of resistor 40 are used. This provides a higher resistance in parallel with inductor 33 and capacitor 34 and, therefore, a higher Q. If wide band (lower Q) operation is desired then controller 23 causes switch 35 to close so that one segment, such as segment 40B, is bypassed and only the other segment, such as segment 40A, is used. This provides a lower resistance in parallel with inductor 33 and capacitor 34 and, therefore, a lower Q. Switch 35 can be positioned to bypass either segment of resistor 40.

Figure 4:
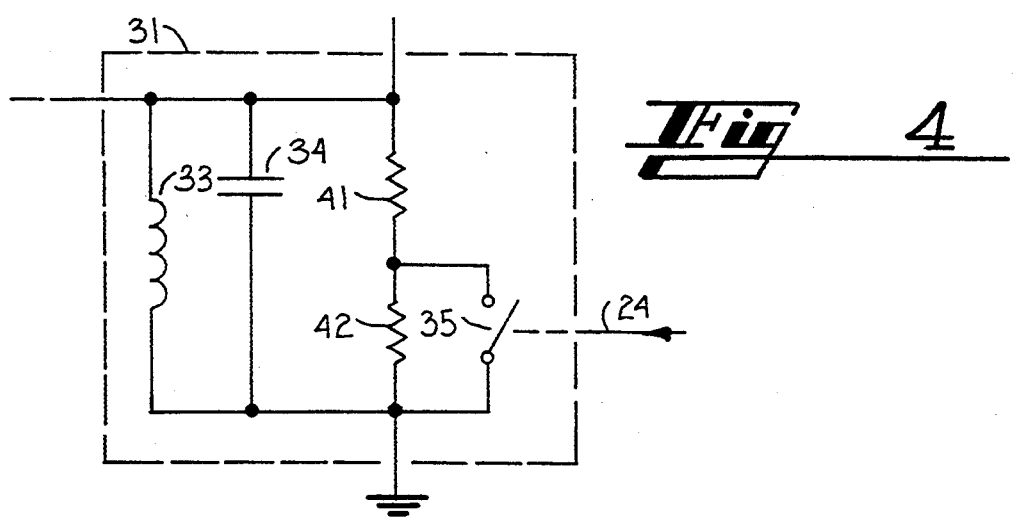
FIG. 4 is a schematic diagram of an alternative embodiment of the phase shifting circuit.

FIG. 4 is a schematic diagram of an alternative embodiment of the phase shifting circuit 31. In this embodiment two resistors 41, 42 are connected in series and switch 35 selectably bypasses one of the resistors. This is identical in operation to the embodiment of FIG. 3 but uses two resistors 41, 42 instead of a single, tapped resistor 40.

It will be appreciated from the above that the present invention provides a dual mode quadrature detector which uses a minimum number of components and maximizes the common use of components for both narrow band and wide band operation. Although the preferred environment of the present invention is such that only two modes of operation are desired, the present invention is not so limited. For example, switch 35 may be a multiple position switch which selects from a plurality of resistance values so as to provide for operation with a plurality of different bandwidth modes. Other embodiments of the present invention may become apparent to those of skill in the art after a reading of the detailed description above and an inspection of the accompanying drawing figures. Therefore, the scope of the present invention is to be limited only by the claims below.

I claim:

1. A frequency modulated (FM) signal detector responsive to a mode control signal for demodulating an input FM signal to provide a demodulated output signal, comprising in combination:
   a tuned circuit, having a variable quality factor (Q) and connected to said input FM signal, responsive to said mode control signal being in a first state for providing a phase shifted input FM signal having a first phase shift by providing a first Q, and responsive to said mode control signal being in a second state for providing said phase shifted input FM signal having a second phase shift by providing a second Q;
   a multiplier having a first input connected to said input FM signal and a second input connected to said phase shifted input FM signal, for providing a product signal by multiplying said input FM signal and said phase shifted input FM signal; and
   a filter for removing undesired signals from said product signal to provide said demodulated output signal.

2. The FM detector of claim 1 wherein said tuned circuit comprises:
   a first capacitor connected between said input FM signal and said second input of said multiplier; and
   a parallel resonant circuit connected between said second input and a reference point, and responsive to said mode control signal for providing either said first Q or said second Q.

3. The FM detector of claim 2 wherein said parallel resonant circuit comprises:
   a second capacitor connected between said second input and said reference point;
   an inductor connected in parallel with said second capacitor; and
   a resistor circuit, connected in parallel with said second capacitor, and responsive to said mode control signal for providing either said first Q or said second Q by providing either a first resistance or a second resistance.

4. The FM detector of claim 3 wherein said resistor circuit comprises:
   a first resistor;
   a second resistor; and
   a switch, connected to said first resistor and said second resistor, and responsive to said mode control signal for connecting either said first resistor or said second resistor in parallel with said second capacitor.

5. The FM detector of claim 3 wherein said resistor circuit comprises:
   a resistor having a tap point, said resistor providing a resistance value, said tap point providing a portion of said resistance value; and
   a switch, connected to said resistor and to said tap point, and responsive to said mode control signal for connecting either said resistor in parallel with said second capacitor or said portion of said resistor in parallel with said second capacitor.

6. The FM detector of claim 3 wherein said resistor circuit comprises:
   a first resistor;
   a second resistor connected in series with said first resistor to form a series resistor; and
   a switch, connected to said series resistor, and responsive to said mode control signal for connecting either said first resistor or said series resistor in parallel with said second capacitor.

7. A method responsive to a mode control signal for demodulating an input frequency modulated (FM) signal to provide a demodulated output signal, comprising the steps of:
   responding to said mode control signal being in a first state for providing a phase shifted input FM signal having a first phase shift, and responding to said mode control signal being in a second state for providing said phase shifted input FM signal having a second phase shift;
   providing a product signal by multiplying said input FM signal and said phase shifted input FM signal; and
   providing said demodulated output signal by removing undesired signals from said product signal.

8. The method of claim 7 wherein said step of responding to said mode control signal comprises providing said phase shifted input FM signal by varying the quality factor (Q) of a tuned circuit in response to said mode control signal.

9. The method of claim 8 wherein said step of responding to said mode control signal comprises varying the resistance of a resistor in said tuned circuit in response to said mode control signal.

10. A dual mode frequency modulated (FM) signal receiver, comprising in combination:
    a receiver front end for receiving an input RF signal and providing an intermediate frequency (IF) signal;
    a tuned circuit, having a variable quality factor (Q) and connected to said IF signal, responsive to a mode control signal being in a first state for providing a phase shifted IF signal having a first phase shift by providing a first Q, and responsive to said mode control signal being in a second state for providing said phase shifted IF signal having a second phase shift by providing a second Q;

a multiplier having a first input connected to said IF signal and a second input connected to said phase shifted IF signal, for providing a product signal by multiplying said IF signal and said phase shifted IF signal;

a filter for removing undesired signals from said product signal to provide a demodulated output signal; and a controller, responsive to a control signal contained in said IF signal, for providing said mode control signal.

11. The dual mode FM receiver of claim 10 wherein said tuned circuit comprises:

a first capacitor connected between said IF signal and said second input of said multiplier; and a parallel resonant circuit connected between said second input and a reference point, and responsive to said mode control signal for providing either said first Q or said second Q.

12. The dual mode FM receiver of claim 11 wherein said parallel resonant circuit comprises:

a second capacitor connected between said second input and said reference point;

an inductor connected in parallel with said second capacitor; and a resistor circuit, connected in parallel with said second capacitor, and responsive to said mode control signal for providing either said first Q or second Q by providing either a first resistance or a second resistance.

13. The dual mode FM receiver of claim 12 wherein said resistor circuit comprises:

a first resistor;

a second resistor; and a switch, connected to said first resistor and said second resistor, and responsive to said mode control signal for connecting either said first resistor or said second resistor in parallel with said second capacitor.

14. The dual mode FM receiver of claim 12 wherein said resistor circuit comprises:

a resistor having a tap point, said resistor providing a resistance value, said tap point providing a portion of said resistance value; and a switch, connected to said resistor and to said tap point, and responsive to said mode control signal for connecting either said resistor in parallel with said second capacitor or said portion of said resistor in parallel with said second capacitor.

15. The dual mode FM receiver of claim 12 wherein said resistor circuit comprises:

a first resistor;

a second resistor connected in series with said first resistor to form a series resistor; and a switch, connected to said series resistor, and responsive to said mode control signal for connecting either said first resistor or said series resistor in parallel with said second capacitor.

* * * * *